United States Patent
Parsa et al.

(10) Patent No.: US 7,548,591 B2
(45) Date of Patent: Jun. 16, 2009

(54) QUADRATURE MODULATOR AND CALIBRATION METHOD

(75) Inventors: Ali Parsa, Los Angeles, CA (US); Ali Fotowat-Ahmady, Richmond Hill (CA); Ali Faghfuri, Stanford, CA (US); Mahta Jenabi, Richmond Hill (CA); Emmanuel Riou, Santa Clara, CA (US); Wilhelm Steffen Hahn, Los Altos, CA (US)

(73) Assignee: NXP B.V., Eindhoven (NL)

( * ) Notice: Subject to any disclaimer, the term of this patent is extended or adjusted under 35 U.S.C. 154(b) by 606 days.

(21) Appl. No.: 10/554,020

(22) PCT Filed: Apr. 20, 2004

(86) PCT No.: PCT/IB2004/001191

§ 371 (c)(1),
(2), (4) Date: Oct. 21, 2005

(87) PCT Pub. No.: WO2004/095686

PCT Pub. Date: Nov. 4, 2004

(65) Prior Publication Data

US 2006/0208820 A1 Sep. 21, 2006

Related U.S. Application Data

(60) Provisional application No. 60/465,127, filed on Apr. 24, 2003.

(51) Int. Cl.
*H04L 27/36* (2006.01)
*H04B 1/04* (2006.01)

(52) U.S. Cl. ..................................... 375/298; 455/126
(58) Field of Classification Search ................. 375/298, 375/296, 297, 295; 332/103; 455/126, 302, 455/303
See application file for complete search history.

(56) References Cited

U.S. PATENT DOCUMENTS 5,396,196 A 3/1995 Blodgett
5,881,376 A 3/1999 Lundberg et al.

(Continued)

FOREIGN PATENT DOCUMENTS

EP 0 598 585 A2 5/1994
GB 2 213 006 A 8/1989

*Primary Examiner*—Khai Tran
(74) *Attorney, Agent, or Firm*—Lisa K. Jorgenson; E. Russell Tarleton; Seed IP Law Group PLLC

(57) ABSTRACT

A quadrature modulator and a method of calibrating same by applying a first test tone signal to an in-phase modulation branch input of the modulator and a ninety degree phase-shifted version of the first test tone signal to a quadrature modulation branch input of the modulator. The carrier leakage level in an output signal of the modulator is measured and in response base band dc offset voltages are adjusted to minimize the carrier leakage. A second test tone signal is applied to the in-phase modulation branch input and a ninety degree phase-shifted version of the second test tone signal to the quadrature modulation branch input. The level of an undesired upper sideband frequency component in the output signal is measured and in response base band gains the in-phase and quadrature modulation branches and a local oscillator phase error are adjusted to minimize the undesired sideband.

15 Claims, 7 Drawing Sheets

U.S. PATENT DOCUMENTS

| | | |
|---|---|---|
| 6,169,463 B1 | 1/2001 | Mohindra et al. |
| 6,185,260 B1 * | 2/2001 | Ishii .......................... 375/279 |
| 6,298,096 B1 | 10/2001 | Burgin |
| 6,421,397 B1 | 7/2002 | McVey |
| 6,771,709 B2 * | 8/2004 | Huang et al. ................ 375/296 |
| 2002/0137487 A1 * | 9/2002 | Yochem ...................... 455/303 |

* cited by examiner

QUADRATURE MODULATOR AND CALIBRATION METHOD

CROSS REFERENCE TO RELATED APPLICATION

This application claims the benefit of U.S. Provisional Application Ser. No. 60/465,127, filed Apr. 24, 2003 which is incorporated herein by reference.

The invention relates to a quadrature modulator, a radio communication device comprising a quadrature modulator, and a method of calibrating the quadrature modulator or radio communication device.

The invention relates to a quadrature modulator, a radio communication device comprising a quadrature modulator, and a method of calibrating the quadrature modulator or radio communication device.

In a quadrature modulator, carrier leakage reduction and side band rejection have typically been carried out using one of two conventional methodologies. One of these methodologies depends on circuit matching, dynamic swapping, and the use of polyphase filters, all of which are carried out in the design phase. The second type of methodology deals with an imperfect chip but relies on user calibration methods while the chip is in use.

One example of the second methodology is disclosed in U.S. Pat. No. 6,169,463 to Mohindra et al. which discloses a quadrature modulator with set and forget carrier leakage compensation. Upon the power-up of the quadrature modulator, carrier leakage is measured in the in-phase and quadrature branches through the use of a synchronous detector. A state machine starts signal generators which inject compensation signals into the in-phase and quadrature branches, respectively, so that DC offsets in these branches are reduced thereby reducing the carrier leakage. Mohindra does not, however, disclose the rejection of undesired side bands. Mohindra proposes a simple detection scheme which can be difficult to implement since it does not distinguish between carrier leakage and side-tones or other errors. Also the large dynamic range of the signals that have to be suppressed require cumbersome and slow "gain-set" and "error-detect" sequences that have to be implemented in software.

It is desirable to not only suppress the carrier leakage but also to reduce undesired sidebands using minimal, and low cost, circuitry. It is also desirable to minimize the search for appropriate circuit parameters to reduce these undesirable circuit parameters.

One aspect of the invention relates to a method of calibrating a quadrature modulator. The method includes: applying a first test tone signal to an in-phase modulation branch input of the modulator and a ninety degree phase-shifted version of the first test tone signal to a quadrature modulation branch input of the modulator, measuring the level of a local oscillator (LO) feedthrough in an output signal of the modulator and in response adjusting base band dc offset voltages to minimize the LO feedthrough; applying a second test tone signal to the in-phase modulation branch input and a ninety degree phase-shifted version of the second test tone signal to the quadrature modulation branch input; and measuring the level of an undesired upper sideband frequency component in the output signal and in response adjusting base band gains the in-phase and quadrature modulation branches and a LO phase error to minimize the undesired side band.

In the preferred embodiment, the level of the local oscillator (LO) feedthrough or the undesired sideband in the output signal is measured by: shifting the frequency spectrum of the output signal such that a lower sideband frequency component (LSB) is down-converted to zero IF; filtering the spectrum-shifted signal to pass through either the LO feedthrough or the undesired sideband, such as an upper sideband; and measuring the amplitude of the filtered, spectrum-shifted signal.

Another aspect of the invention relates to a quadrature modulator which includes an in-phase modulation branch and a quadrature modulation branch. The in-phase modulation branch receives an analog in-phase base band signal as an input, and includes a first dc offset adjustment circuit, a first base band gain adjustment circuit, and a first mixer. The quadrature modulation branch receives an analog quadrature based band signal as an input, and includes a second dc offset adjustment circuit, a second base band gain adjustment circuit, and a second mixer. A local oscillator means provides a local oscillator signal to the first mixer and a phase shifted version of the local oscillator signal to the second mixer. A summer sums the outputs of the first and second mixers. An envelope detector detects an output signal of the modulator and provides a signal representative of the amplitude of the output signal. A band pass filter filters the amplitude signal. A signal strength indicator circuit measures the strength of the filtered amplitude signal, and provides a compensation signal for adjusting the phase shift of the local oscillator and the dc offsets and base band gains of the in-phase and quadrature base band signals.

In the preferred embodiment the envelope detector is a synchronous detector and the signal strength indicator is a log indicator. Means are provided for applying a first test tone signal to the in-phase modulation branch input and a ninety degree phase-shifted version of the first test tone signal to the quadrature modulation branch input. The compensation signal is employed to minimize carrier leakage in the output signal by adjusting the base band dc offsets in the in-phase and quadrature branches. A second test tone signal is then applied to the in-phase modulation branch input and a ninety degree phase-shifted version of the second test tone signal is applied to the quadrature modulation branch input. The second test tone has a frequency that is substantially one half of the frequency of the first test tone. The compensation signal to is employed minimize an undesired upper sideband frequency component in the output signal by adjusting the base band gains the in-phase and quadrature modulation branches and the phase shift of the local oscillator signal.

The preferred synchronous envelope detector comprises a Gilbert cell having at least one differential transistor pair in an upper branch and at least one transistor in a lower branch, the upper and lower branches being interconnected, with each of the upper and lower branches having input terminals. A resistor divider network is connected between the input terminals of the upper branch and the input terminals of the lower branch. The resistive values of the network are selected such that a selected input signal having a signal level sufficient to saturate the transistors of the upper branch is attenuated so as to not saturate the transistors of the lower branch. A low pass filter is connected to the upper branch of transistors, and an output signal of the detector is provided at the low pass filter.

Figure 1:
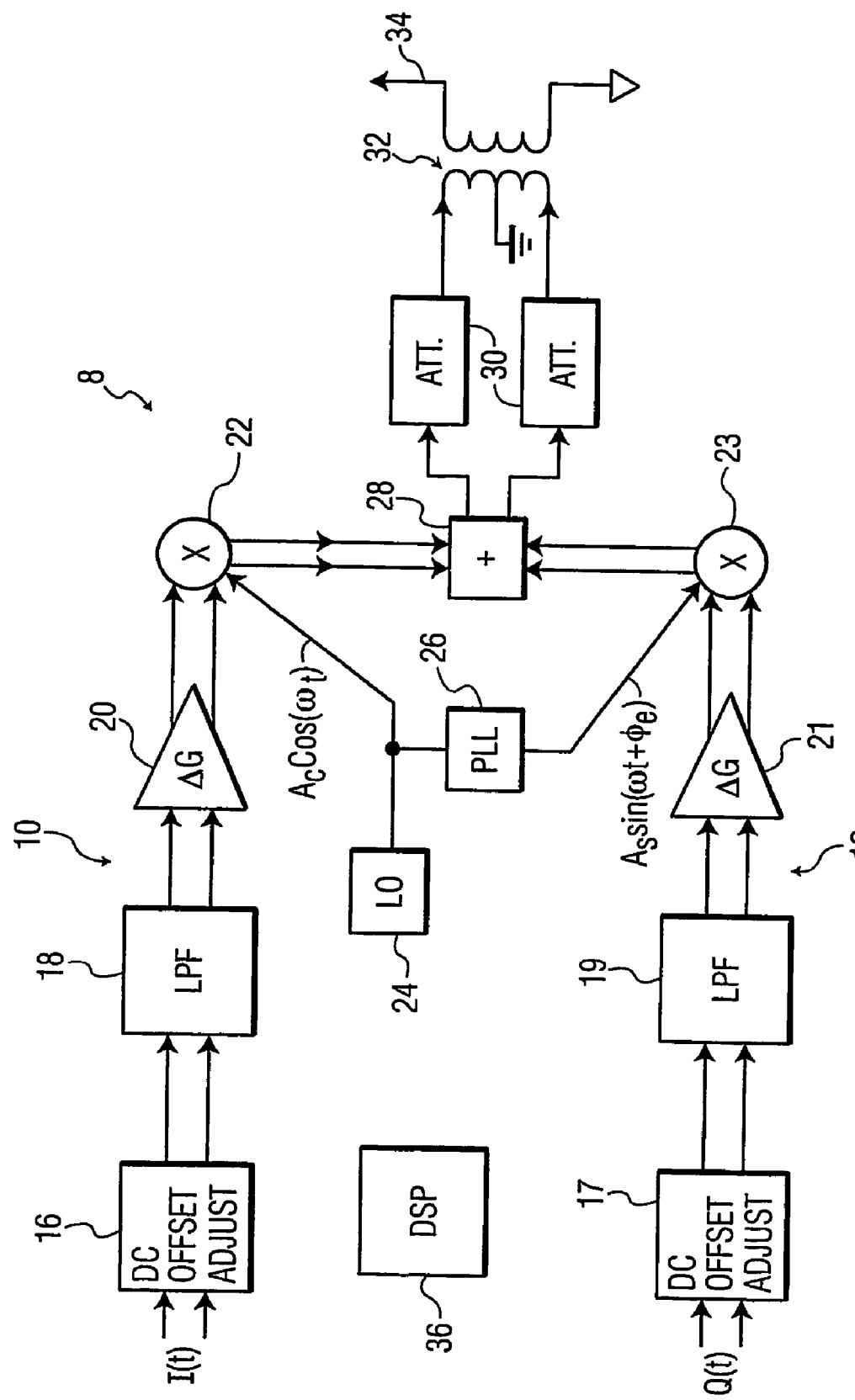
FIG. 1 is a system block diagram of a prior art quadrature modulator.

FIG. 1 shows a quadrature transmitter 8 which includes an in-phase modulation branch 10 and a quadrature modulation branch 12. The in-phase branch 10 includes, in series arrangement, a base band dc offset adjustment block 16, a low pass filter 18, a base band gain adjustment amplifier 20, and mixer 22. The mixer 22 mixes an in-phase signal I(t) (an analog signal carrying digital information) with a sinusoidal carrier signal $A_c \cos(\omega_t)$ generated by a local oscillator (LO) 24. The quadrature phase branch 12 includes, in series arrangement, a dc base band offset adjustment block 17, a low pass filter 19, a gain adjustment amplifier 21, and a mixer 23. The mixer 23 mixes a quadrature signal Q(t) with a carrier signal $A_s \sin(\omega t + \phi_e)$ that is generated by the local oscillator 24 and phase shifted 90°, in the ideal case, by a phase shift circuit such as a phase locked loop (PLL) 26. $\phi_e$ represents the phase shift error.

The outputs of the mixers 22 and 23 are summed by a summer 28, the output of which is fed to a digitally programmable attenuator 30. In the preferred embodiment the transmitter 8 operates on differential signals, and so the output of the attenuator 30 is fed to a transformer 32 which converts the differential signals to a single ended signal to be radiated through an antenna 34.

A digital signal processor (DSP) 36 controls various circuits such as the DC offset adjustment blocks 16, 17, the gain amplifiers 20, 21, the PLL 26 and the attenuator 30. The DSP 36 also executes a calibration algorithm which is described in greater detail below.

Figure 2:
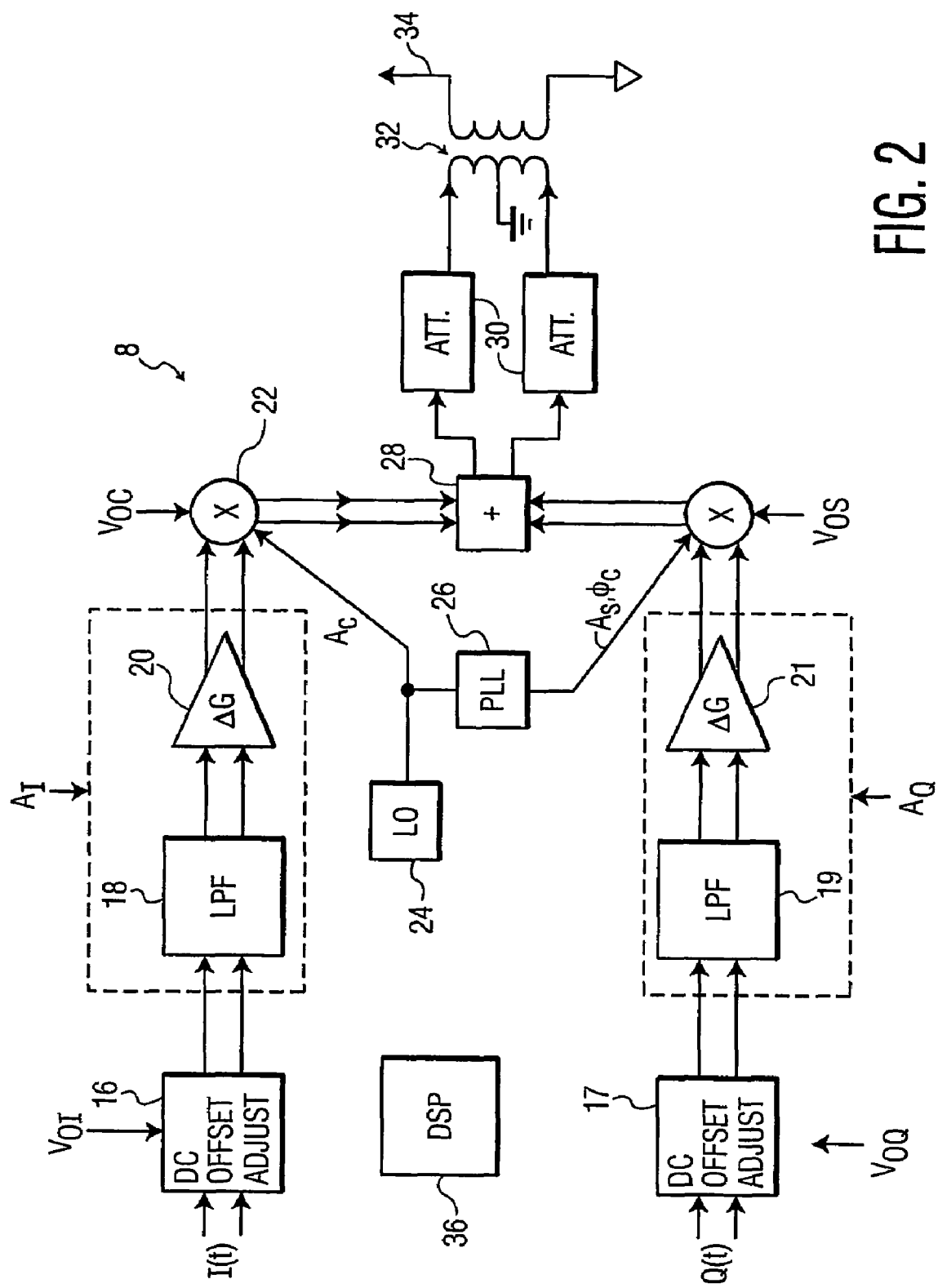
FIG. 2 illustrates the existence of various non-idealities in the quadrature modulator of FIG. 1.

A number of imperfections or non-idealities are present in the quadrature transmitter 8 as shown, and in other quadrature transmitters similar thereto. These non-idealities arise, inter alia, from the following sources, as indicated in FIG. 2:

$A_I$, $A_Q$ Baseband gain in the in-phase and quadrature branches, respectively, which may not be equal $V_{OI}$, $V_{OQ}$ Built-in equivalent dc offset voltage in the in-phase and quadrature branches, respectively, which may not be zero $A_C$, $A_S$ Local oscillator amplitudes in the in-phase and quadrature branches, respectively, which may not be equal $V_{OC}$, $V_{OS}$ Local oscillator equivalent offset voltages in the in-phase and quadrature branches, respectively, which may not be zero $\phi_e$ Local oscillator quadrature phase error Consequently, the transmit signal, s(t), can be written in the following general form:

$$s(t) = (A_I I(t) + V_{OI})(A_C \cos(\omega_{LO} t) + V_{OC}) + (A_Q Q(t) + V_{OQ})(A_S \sin(\omega_{LO} t + \phi_e) + V_{OS}) \quad [1]$$

where $\phi_{LO}$ is the local oscillator frequency, and

I(t), Q(t) are the in-phase and quadrature signals, as discussed above.

It will be seen from equation [1] that if the non-idealities are eliminated, s(t) reduces to an ideal quadrature signal:

$$I(t)\cos(\omega_{LO} t) + Q(t)\sin(\omega_{LO} t) \quad [2]$$

If the input baseband signals are defined as $I(t) = V_I \cos(\omega_B t)$ and $Q(t) = V_Q \sin(\omega_B t)$, expanding equation [1] yields three major terms as follows:

$$V_{OI} * A_C \cos(\omega_{LO} t) + V_{OQ} * A_s \sin(\omega_{LO} t + \phi_e) \quad [3]$$

$$A_I V_I A_C \cos(\omega_{LO} t - \omega_B) - A_Q V_Q A_S \cos(\phi_e) \cos(\omega_{LO} t + \omega_B t) + A_Q V_Q A_S \sin(\phi_e) \sin(\omega_{LO} t + \omega_B t) \quad [4]$$

$$A_I V_I A_C \cos(\omega_{LO} t - \omega_B t) + A_Q V_Q A_S \cos(\phi_e) \cos(\phi_{LO} t - \phi_B t) - A_Q V_Q A_S \sin(\omega_{LO} t - \omega_B t) \quad [5]$$

Equation [3] is referred to as the local oscillator (LO) feed-through or carrier leakage term because this component of the output spectrum is centered at $\omega_{LO}$. It will be seen that if the dc offset adjustment can be properly adjusted at blocks 16 and 17, the LO feed-through can be eliminated or reduced.

Equation [4] is referred to as the "upper side band" (USB) term since this component of the output spectrum is centered at a frequency, $\omega_{LO} + \omega_B$, which is higher than the local oscillator frequency. Similarly, equation [5] is referred to as the "lower side band" (LSB) term since this component of the output spectrum is centered at $\omega_{LO} - \omega_B$, which is lower than the local oscillator frequency.

Assuming positive parameters, the LSB will be the stronger frequency component and hence the desired signal, and the USB will be the weaker, and hence undesired signal. From equation [4], it will be seen that a base band gain mismatch, $A_I \neq A_Q$, a local oscillator level mismatch, $A_C \neq A_S$, and the local oscillator phase error $\phi_e$ are responsible for the residual USB term. The proper control of these system parameters can minimize the undesired sideband. However, efforts to minimize the undesired sideband to less than 50 dBc in the analog domain requires base band and high frequency gain matching on the order of 0.05 dB and phase matching of 0.4 degrees. Conventional analog circuits do not allow such matching levels to be achieved.

Figure 3:
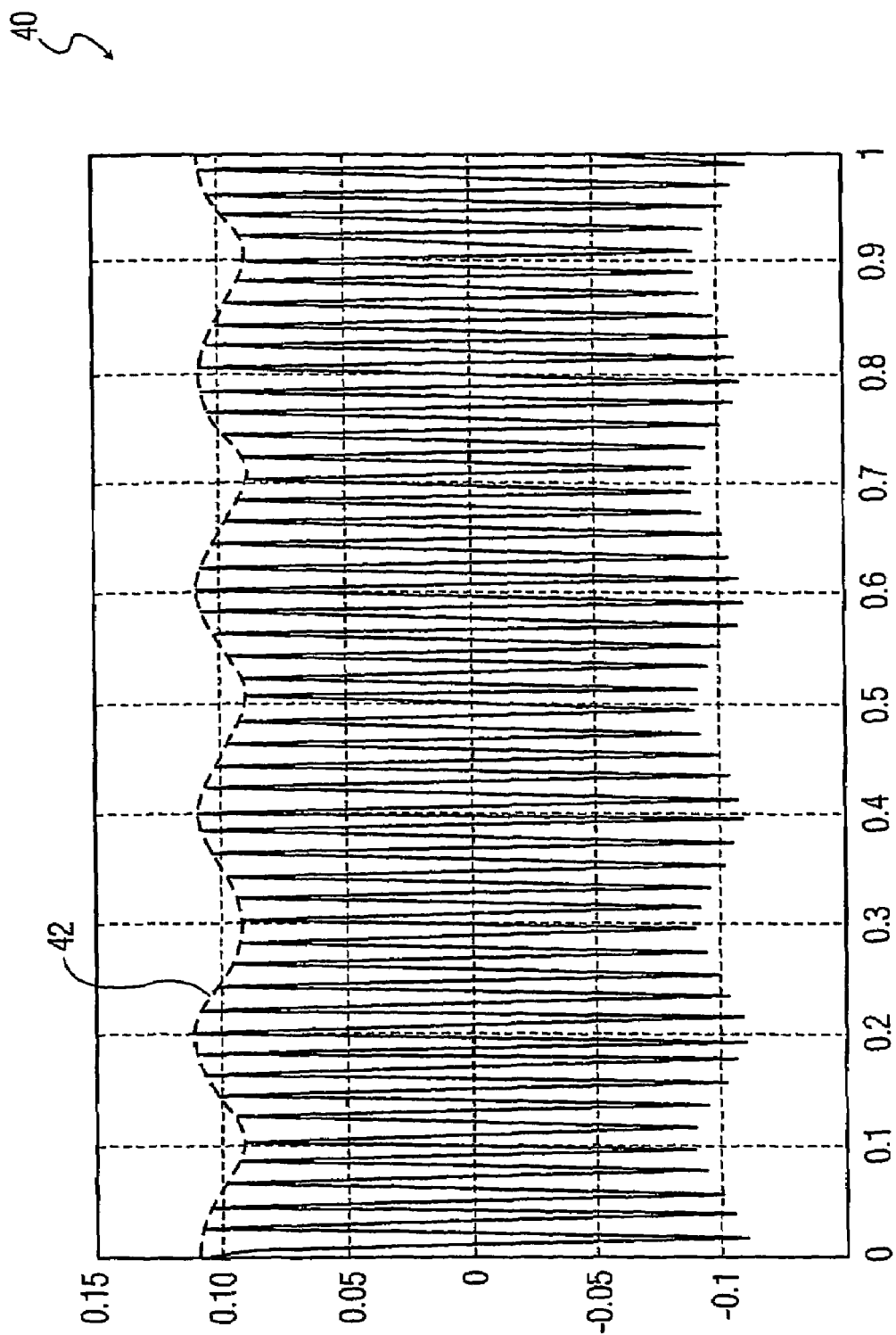
FIG. 3 illustrates the waveform of a two-tone signal in the time domain.

Rather than trying to improve matching and phase control by either improved layouts or dynamic techniques, the present invention measures the output signal s(t) and adjusts the following system parameters $A_I$, $A_Q$; $V_{OI}$, $V_{OQ}$; and $\phi_e$ until the LO feed-through and USB components are minimized. This is accomplished by taking advantage of the fact that the LSB component will typically have a greater magnitude than the USB component or the LO feed-through. FIG. 3 exemplifies a two tone signal 40 in the time domain which is a sum of two sinusoidal components, $A_{St} \cos(\omega_{st} t) + A_{we} \cos(\omega_{we} t)$, where the first component has a much higher amplitude than the second component. It will be seen from FIG. 3 that the envelope 42 (shown in stippled lines) of the two tone signal 40 is a sinusoid having the amplitude of the weak signal and a frequency equal to the difference between the two tones. More particularly, the envelope of the two tone signal 40 can be written as $A_{St} + A_{we} \cos(\omega_{st} t - \omega_{we} t)$. Thus, if, for example, the weaker signal is the USB component and the stronger signal is the LSB component, measuring the envelope of such a two tone signal will enable the opportunity to adjust system parameters to reduce the level of the weaker or undesired signal.

Figure 4:
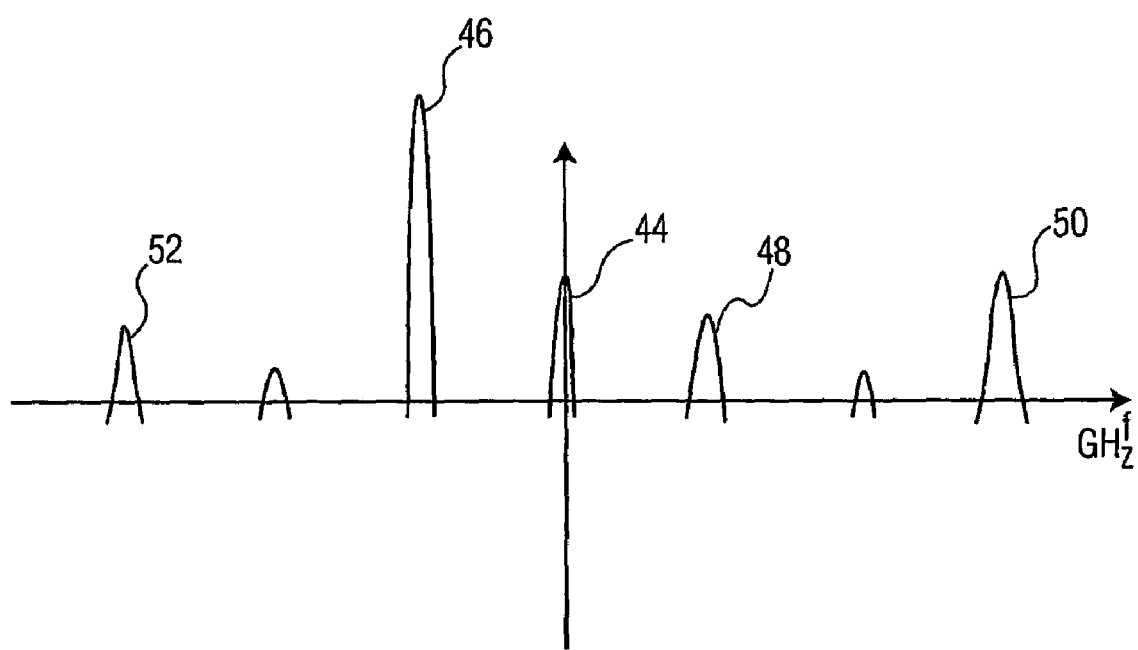
FIG. 4 illustrates the output spectrum of the prior art quadrature modulator in the frequency domain when the base band input is a test tone.

In practice, however, the output s(t) of the transmitter, is not a two component signal but will have many frequency components. FIG. 4 illustrates a typical frequency spectrum for s(t). In this plot, the central axis is centered on the local oscillator frequency, e.g., at 1 GHz. Frequency component 44 represents the LO feed-through, component 46 represents the USB and component 48 represents the LSB. In addition, strong and weak $3^{rd}$ harmonics exist, as represented by components 50 and 52, respectively. Accordingly, as the output signal s(t) has multiple frequency components in addition to the desired component, the preferred embodiment filters at least some of the frequency components so that a two tone signal is substantially present. Note that the higher harmonics, being relatively small in amplitude, will not materially affect the shape of the envelope. In addition since the higher harmonics decrease substantially faster than the main signal the user will be able to reduce them by proper choice of the main signal levels (e.g. for every 1 dB reduction in the level of the LSB as in FIG. 4, the $3^{rd}$ harmonics go down 3 dB).

Figure 5:
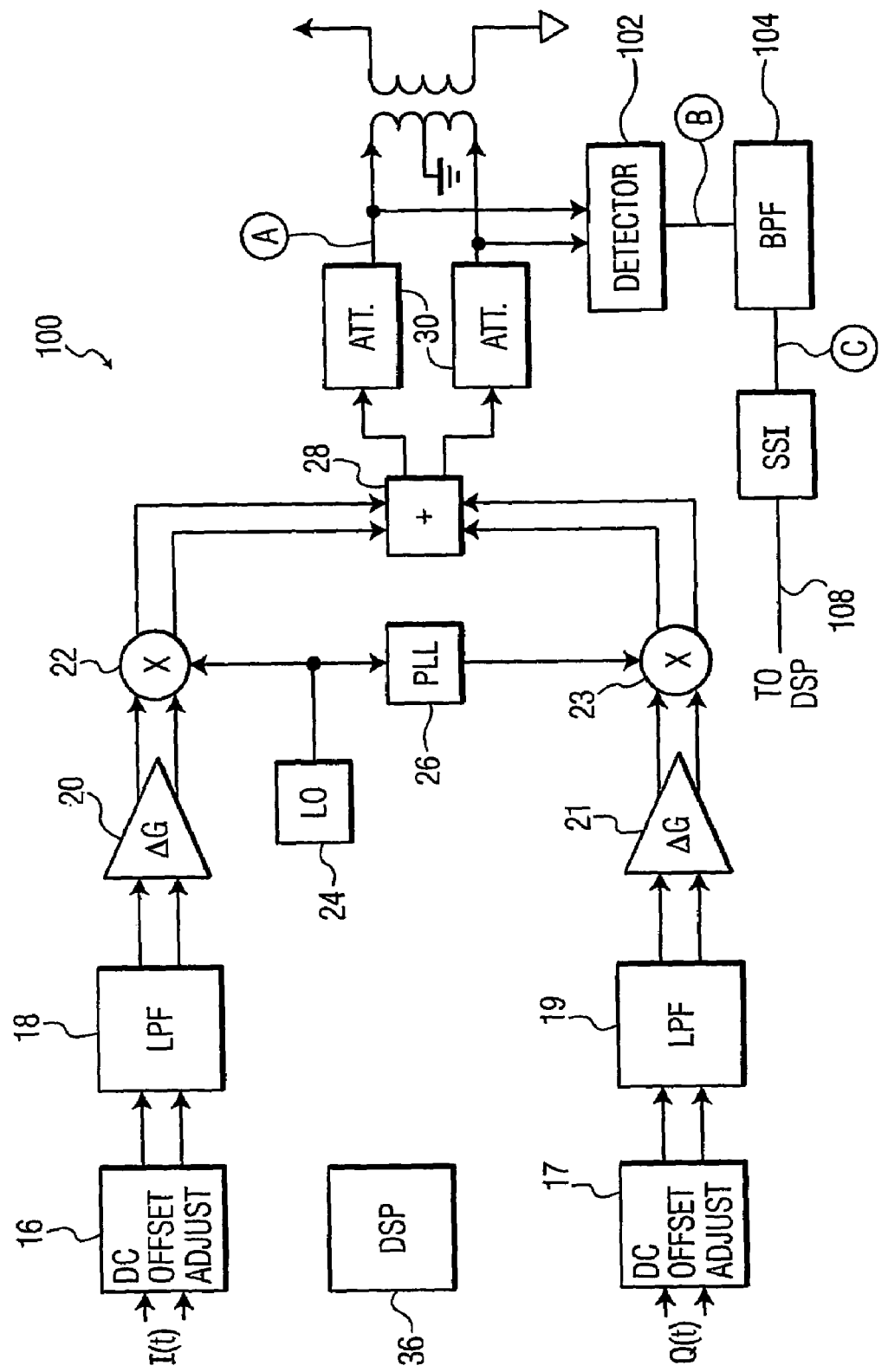
FIG. 5 is a system block diagram of a quadrature modulator according to the preferred embodiment which includes circuitry for calibrating the modulator.

FIG. 5 is a system block diagram of a quadrature modulator 100 according to the preferred embodiment of the invention which employs a high dynamic range envelope detector 102, a band pass filter 104, and a signal strength indicator circuit 106. The detector 102 is positioned to detect s(t) at point A, at the output the attenuator 30. The detector 102 provides a signal at point B which represents the envelope of s(t). This envelope is then filtered by the band pass filter 104 so as to allow through (at point C) the frequency component that should be minimized. The logarithmic signal strength indicator circuit 106 measures the strength of the passed-through frequency component and provides a signal 108 which is then used by the DSP 36 to adjust the system parameters of the modulator.

The modulator is preferably calibrated In a two phase process. In the first phase, the LO feed-through is minimized and in the second phase the USB component is minimized, although in alternative embodiments these phases may be executed reversed in order.

Figure 6:
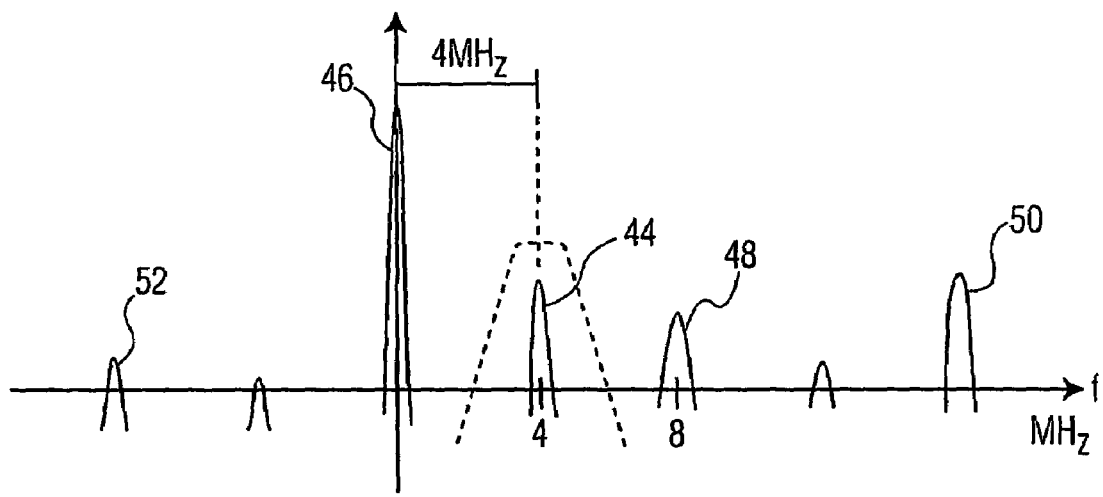
FIG. 6 illustrates the output spectrum of the preferred quadrature modulator in the frequency domain when a first test tone is applied thereto for the purposes of a calibration phase to eliminate carrier leakage.

In the preferred first phase, a first test tone, e.g., 4 MHz, is applied to the I and Q base band inputs of the transmitter (the tone applied at the Q input being 90 degrees out of phase with the tone applied at the I input). The tones are generated by the DSP 36 or alternatively by any other known tone generator. The output spectrum at point A is as shown in FIG. 4, having the desired LSB component 46, and smaller LO feed-through and USB components 44, 48 plus $2^{nd}$ and $3^{rd}$ harmonic components. The envelope detector 102 essentially shifts the frequency spectrum of the detected s(t) such that at point A, as shown in FIG. 6, the LSB component 46 is shifted to zero frequency, the LO feed-through component 44 is shifted to the frequency of the test tone, 4 MHz, and the USB component 48 is shifted to a frequency that is double that of the test tone. The band pass filter 104 is preferably configured with a sharp passband centered at 4 MHz which passes through substantially only the LO feed-through (as schematically illustrated in FIG. 6) 44, and thus controls the presence of various other undesired components. The logarithmic signal strength indicator 106 measures the level of the LO feedthrough 44 and generates a signal which is used by the DSP 36 to minimize the LO feed-through 44. The LO feed-through 44, even though it may arise as a result of leakage through the substrate of the chip can be nulled out by adjusting the DC offset voltages $V_{OI}$ and $V_{OQ}$ so as to cause the LO feed-through 44 to cancel out at point A. Note that $V_{OI}$ and $V_{OQ}$ are independent of each other and need to be separately nulled, thus requiring a two dimensional search to find the optimum values for the DC offsets.

Figure 7:
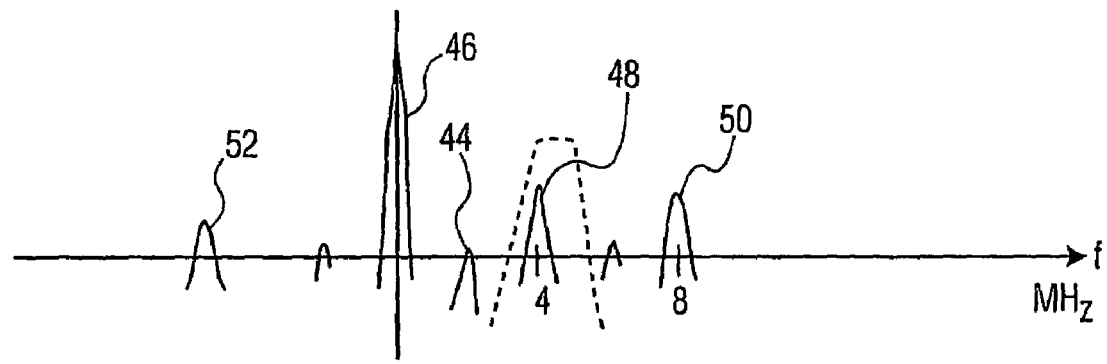
FIG. 7 illustrates the output spectrum of the preferred quadrature modulator in the frequency domain when a second test tone, being one half the frequency of the first test tone, is applied to the modulator for the purposes of a second calibration phase to eliminate an undesired side band.

In the second phase of the calibration process, once the LO feed-through 44 has been minimized, a second test tone at half the frequency of the first test tone, e.g., 2 MHz, is applied to the I and Q base band inputs of the modulator. After passing through the envelope detector 102 the frequency spectrum at point C resembles that shown in FIG. 7, wherein the USB component 48 is separated from the LSB component 46 by twice the value of the second test tone signal. This allows the very same band pass filter 106 to be used to propagate substantially only the USB component 48 (as schematically illustrated in FIG. 7) to the logarithmic signal strength indicator 106. The signal strength indicator 106 generates the signal 108 which is used by the DSP 36 to adjust the base band gains $A_I$ or $A_S$ at gain adjustment blocks 20, 21 and the local oscillator phase error $\phi_e$ at PLL 26 in order to minimize the USB component. This also requires a two dimensional search.

The calibration process is of the "set and forget" type. It may be applied upon power up of the modulator, or at certain discrete instances such as inactive time slots. There is no need to continuously adjust the system parameters.

Note that the band pass filter 104 will reduce the effect of the strong $3^{rd}$ harmonic distortion component 50. The weak $3^{rd}$ harmonic component 52, however, falls directly on the sideband signal 48 after the envelope detector. The level of this distortion product is typically more than 60 dBc and is not likely to cause any problems. Its level can be reduced by 3 dB for every dB of reduction in the main test tone signals I(t) and Q(t) during the calibration phase.

A bandpass filter can be arranged prior to the envelope detector but that requires costly high Q filters that are impractical. Those skilled in the art will the band pass filter can be a programmable band pass filter disposed after the detector to filter out undesired sidebands and harmonic products.

In the preferred embodiment the modulator 100 provides a large dynamic range capacity, for a number of reasons. First, the RF output level may need to be programmable, which is why the quadrature modulator 100 includes attenuators 30. The detector circuitry preferably detects the signal after the attenuation to minimize signal non-ideality at the point of delivery. Consequently, the level of the LSB component 46 could change dramatically.

Second, it is desired to reduce considerably the level of the detected frequency component, e.g. the LO-feed-through or USB component 48, e.g. from 15 dBc as a starting point to 50 dBc. Adding the variation of the main signal due to the RF level adjustments in the output attenuator, e.g. 25 dB, the dynamic range of the detected signal can be quite high, e.g., 75 dB. For example, assuming a conventional −20 dBm. If level at 1.5 GHz with a 25 dB on-chip programmable attenuator and a requirement that the side bands be suppressed by 50 dB, the signal strength indicator 106 should be sensitive to signals from −20 dBm to −95 dBm. In order to measure such a varying signal with consistent accuracy the signal strength indicator 106 is preferably implemented as a log amplifier/detector, as explained in greater detail below.

Third, a problem may exist since various undesired frequency components are present. These are all detected at the same time but controlled by different mechanisms. This is preferably solved by using a sharp band pass filter as described previously, followed by a limiter for the log detector. The band pass filter 104 pre-selects the frequency component for minimization and the limiter effectively eliminates the other undesired signals that can reduce the measurement accuracy. The limiter captures only the slightly stronger signals when two or more signals are present.

Figure 8:
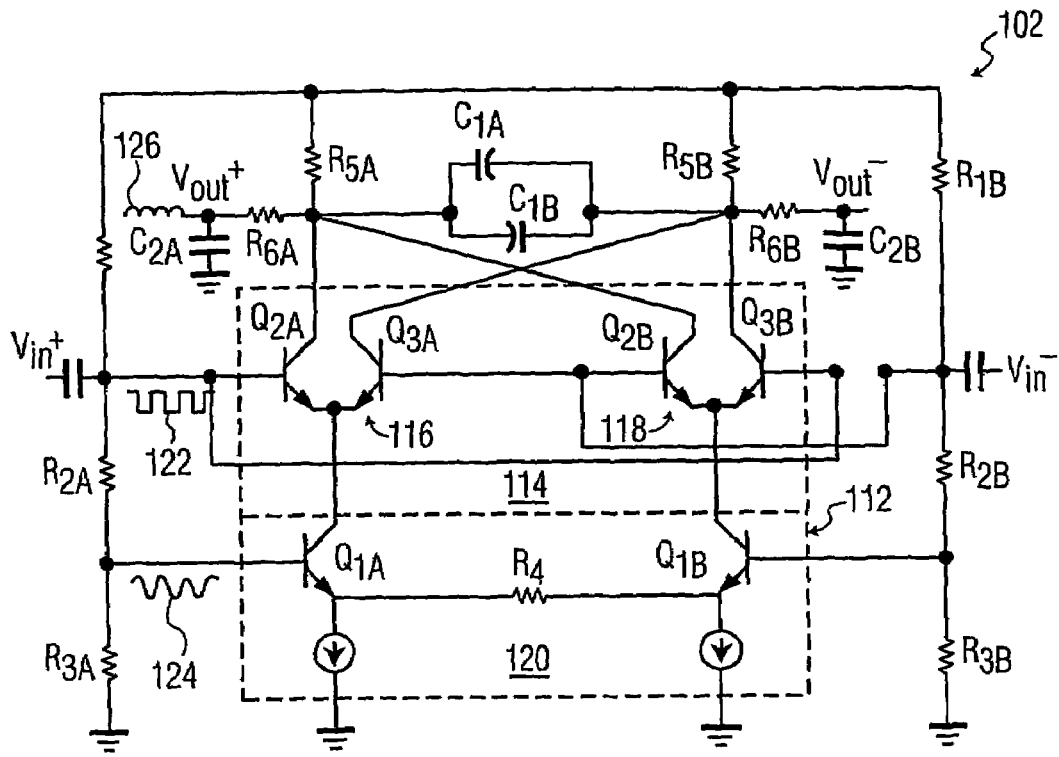
FIG. 8 is a circuit diagram for an envelope detector employed in the preferred embodiment.

FIG. 8 is a circuit diagram of the preferred embodiment of the envelope detector 102. The circuit, which is based in part on a Gilbert cell provides considerably more dynamic range and superior signal to noise ratio than conventional envelope detectors, such as diode-based detectors. The circuit includes an upper tree 114 which includes two differential transistor pairs 116 and 118, comprising transistors $Q_{2A}$, $Q_{3A}$, $Q_{2B}$ and $Q_{3B}$. The circuit 110 also includes a lower tree 120 which includes a second set of transistors $Q_{1A}$ and $Q_{1B}$. The upper tree 114 is connected to the lower tree 120, as shown.

A differential input signal is applied directly to the bases of the transistors of the upper tree 114 at input terminals $V_{in}^+$ and $V_{in}^-$. The differential input signal is highly attenuated by a resistor divider network $R_{2A}$,$R_{3A}$, and $R_{2B}$,$R_{3B}$ and fed to the bases of the transistors of the lower tree 120. The lower tree 120 is highly degenerated in comparison to the upper tree 114. The upper tree transistors switch hard while the degenerated lower tree transistors see the input signal as well as its envelope. Referring back to FIG. 3 the upper tree only sees the zero crossings of the signal 40 and not aware of the envelope 42. The lower tree sees the whole signal 40.

Therefore, the upper and lower trees 114, 120 are used as a multiplier. In this mode, the input signal applied to the upper tree 114 has a signal level exceeding the threshold voltage $V_T$ of the transistors (typically about 4 $V_T$, where $V_T \approx 25$ m$V_{pp}$) whereas the amplitude of the input signal applied to the degenerate lower tree 120 is considerably lower than the threshold voltage (assuming that $R_4$ is zero ohms) due to $R_{2A}$, $R_{3A}$ and $R_{2B}$, $R_{3B}$ attenuators. The upper tree transistors are saturated and thus switch hard such that current flows through one side of the upper tree or the other, depending on the polarity of the input signal. This is schematically represented by square wave train 122. In contrast, the transistors of the degenerated lower tree 120 do not switch hard, and the lower tree functions as an amplifier which is further linearized by the presence of $R_4$, whereby the currents in the collects of $Q_{1A}$ and $Q_{1B}$ are reproductions of the voltages applied to the bases thereof. [This is schematically represented by sinusoidal signal 124. However, as a result of the hard switching of the upper tree transistors the currents in the collectors of $Q_{1A}$ and $Q_{1B}$ are chopped off. At the output, the collectors of $Q_{2A}$, $Q_{3A}$ and $Q_{2B}$, $Q_{3B}$ all have a positive polarity, thus effectively multiplying the input signed by a synchronors square wave, as schematically represented by signal 126.

A set of low pass filters, comprising $R_{6A}C_{2A}$;$R_{5A}C_{1A}+C_{1B}$; $R_{5B}$,$C_{1A}+C_{1B}$; and $R_{6B}$,$C_{2B}$ average the result so that at $V_{out}^+$ and $V_{out}^-$ the output is a differential low frequency signal 42 as shown in FIG. 3. Consequently, the output of the circuit 102 represents the envelope of the input signal. The net result is that the circuit shifts the spectral content of the input signal such that the frequency of the desired component, the LSB term in this example, is down converted to zero IF. The combination of $R_{1A}$, $R_{2A}$, $R_{3A}$ and $R_{1B}$, $R_{2B}$, $R_{3B}$ plus $R_4$, not part of a conventional Gilbert cell, provide simultaneous biasing for the upper tree and biasing plus attenuation for the lower tree for the optimal synchronous detector operation.

Figure 9:
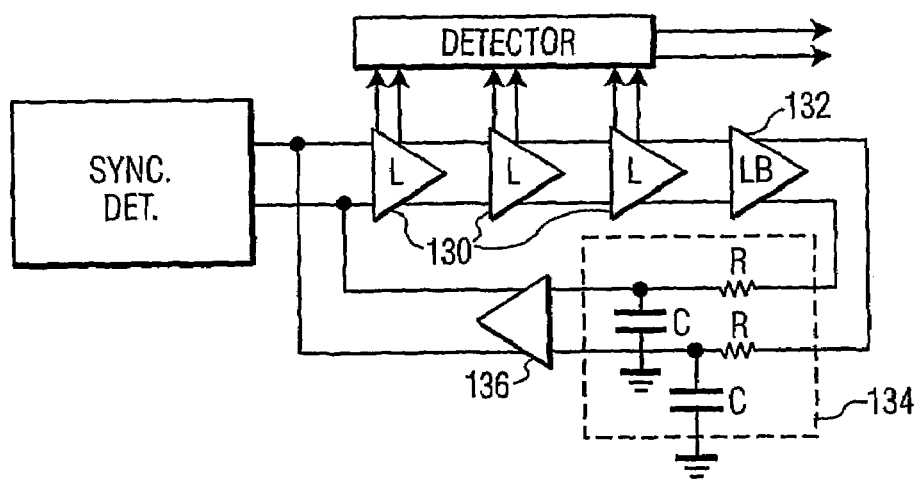
FIG. 9 is a circuit diagram for a signal strength indicator and band pass filter employed on the preferred embodiment.

FIG. 9 is a circuit diagram of the preferred embodiment of the signal strength indicator 106. The circuit employ a series of cascading amplifiers 130, 132 as known in the art per se to provide an output signal which is substantially equivalent to the log of the input signal. This enables a linear range of values, e.g. 1 to 5 volts, to represent variations in the level of the input signal on the order of $10^5$. A low pass filter 134 is incorporated in the feedback path in conjunction with an additional amplifier 136. The circuit effectively provides the band pass filter 104 of FIG. 5 with the low corner frequency being established by the values of R and C, and the high corner frequency being set by the bandwidth of the cascaded series of amplifiers. This results in a first order band pass filter. Higher order tunable active filters could also be placed between the synch detector of FIG. 9 and the secondary detector.

The preferred embodiment has been shown and described as operating with differential signals. Those skilled in the art will understand that the preferred embodiment may be readily varied to operate with single ended signals. Similarly, numerous other modifications may be made to the embodiments described herein without departing from the spirit of the invention.

The invention claimed is:

1. A quadrature modulator, comprising:
    a) an in-phase modulation branch receiving as an input an analog in-phase base band signal, the in-phase modulation branch including a first dc offset adjustment circuit, a first base band gain adjustment circuit, and a first mixer;
    b) a quadrature modulation branch receiving as an input an analog quadrature based band signal, the quadrature modulation branch including a second dc offset adjustment circuit, a second base band gain adjustment circuit, and a second mixer;
    c) a local oscillator means for providing a local oscillator signal to the first mixer and a phase shifted version of the local oscillator signal to the second mixer;
    d) a summer for summing the outputs of the first and second mixers;
    e) an envelope detector for detecting an output signal of the modulator and providing a signal representative of the amplitude of the output signal of the quadrature modulator;
    f) a band pass filter for filtering the amplitude signal; and
    g) a signal strength indicator circuit for measuring the strength of the filtered amplitude signal, the indicator circuit providing a compensation signal for adjusting the phase shift of the local oscillator and the dc offsets and base band gains of the in-phase and quadrature base band signals.

2. The modulator according to claim 1, wherein the envelope detector comprises a synchronous detector and the signal strength indicator comprises a log indicator.

3. The modulator according to claim 2, including a programmable attenuator for adjusting the level of the output signal of the quadrature modulator, and wherein the envelope detector measures the output signal following attenuation.

4. The modulator according to claim 1, including a tone generator for supplying a test tone signal to the in-phase modulation branch input and a ninety degree phase-shifted version of the test tone signal to the quadrature modulation branch input.

5. The modulator according to claim 4, further comprising means for:
    a) applying a first test tone signal to the in-phase modulation branch input and a ninety degree phase-shifted version of the first test tone signal to the quadrature modulation branch input;
    b) employing the compensation signal to minimize carrier leakage in the output signal by adjusting the base band dc offsets in the in-phase and quadrature branches;
    c) applying a second test tone signal to the in-phase modulation branch input and a ninety degree phase-shifted version of the second test tone signal to the quadrature modulation branch input, wherein the second test tone has a frequency that is substantially one half of the frequency of the first test tone; and
    d) employing the compensation signal to minimize an undesired upper sideband frequency component in the output signal by adjusting the base band gains the in-phase and quadrature modulation branches and the phase shift of the local oscillator signal.

6. A method of calibrating a quadrature modulator, comprising:
   a) applying a first test tone signal to an in-phase modulation branch input of the modulator and a ninety degree phase-shifted version of the first test tone signal to a quadrature modulation branch input of the modulator;
   b) measuring the level of a local oscillator (LO) feed through in an output signal of the modulator and in response adjusting base band dc offset voltages to minimize the LO feed through;
   c) applying a second test tone signal to the in-phase modulation branch input of the Quadrature modulator and a ninety degree phase-shifted version of the second test tone signal to the quadrature modulation branch input; and
   d) measuring the level of an undesired upper sideband frequency component in the output signal and in response adjusting base band gains the in-phase and quadrature modulation branches and a LO phase error to minimize the undesired sideband.

7. The method according to claim 6, wherein the second test tone has a frequency that is substantially one half of the frequency of the first test tone.

8. The method according to claim 6, wherein measuring the level of the local oscillator (LO) feed through or the USB in the output signal is carried out by:
   a) shifting the frequency spectrum of the output signal such that a lower sideband frequency component (LSB) is down-converted to zero IF;
   b) filtering the spectrum-shifted signal to pass through either the LO feed through or the USB; and
   c) measuring the amplitude of the filtered, spectrum-shifted signal.

9. The method according to claim 8, wherein the frequency spectrum of the output signal is shifted by a synchronous envelope detector.

10. The method according to claim 9, wherein the synchronous envelope detector comprises:
    a) a Gilbert cell having at least one differential transistor pair in an upper branch and at least one transistor in a lower branch, the upper and lower branches being interconnected, each of the upper and lower branches having input terminals;
    b) a resistor divider network connected between the input terminals of the upper branch and the input terminals of the lower branch, the resistive values of the network being selected such that a selected input signal having a signal level sufficient to saturate the transistors of the upper branch is attenuated so as to not saturate the transistors of the lower branch; and
    c) low pass filter means connected to the upper branch of transistors, an output signal of the detector being provided at the low pass filter.

11. The method according to claim 8, wherein the amplitude of the filtered, spectrum-shifted signal is measured by a log detector which provides a compensation signal employed to minimize the LO feed through or undesired sideband.

12. The method according to claim 11, further comprising selectively attenuating the output signal prior to the step of measuring the output signal.

13. The method according to claim 11, wherein the second test tone has a frequency that is substantially one half of the frequency of the first test tone.

14. A quadrature modulator, comprising:
    a) an in-phase modulation branch receiving as an input an analog in-phase base band signal, the in-phase modulation branch including a first dc offset adjustment circuit, a first base band gain adjustment circuit, and a first mixer;
    b) a quadrature modulation branch receiving as an input an analog quadrature based band signal, the quadrature modulation branch including a second dc offset adjustment circuit, a second base band gain adjustment circuit, and a second mixer;
    c) a local oscillator means for providing a local oscillator signal to the first mixer and a phase shifted version of the local oscillator signal to the second mixer,
    d) a summer for summing the outputs of the first and second mixers;
    e) envelope detection means for detecting an output signal of the modulator and providing a signal representative of the amplitude of the output signal of the quadrature modulator;
    f) band pass filter means for filtering the amplitude signal; and
    g) a log detector for measuring the strength of the filtered amplitude signal, the log detector providing a compensation signal for adjusting the phase shift of the local oscillator and the dc offsets and base band gains of the in-phase and quadrature base band signals.

15. The modulator according to claim 14, further comprising calibration means for:
    a) applying a first test tone signal to the in-phase modulation branch input and a ninety degree phase-shifted version of the first test tone signal to the quadrature modulation branch input;
    b) employing the compensation signal to minimize carrier leakage in the output signal by adjusting the base band dc offsets in the in-phase and quadrature branches;
    c) applying a second test tone signal to the in-phase modulation branch input and a ninety degree phase-shifted version of the second test tone signal to the quadrature modulation branch input, wherein the second test tone has a frequency that is substantially one half of the frequency of the first test tone; and
    d) employing the compensation signal to minimize an undesired upper sideband frequency component in the output signal by adjusting the base band gains the in-phase and quadrature modulation branches and the phase shift of the local oscillator signal.

* * * * *

UNITED STATES PATENT AND TRADEMARK OFFICE
CERTIFICATE OF CORRECTION

| | | |
|---|---|---|
| PATENT NO. | : 7,548,591 B2 | Page 1 of 1 |
| APPLICATION NO. | : 10/554020 | |
| DATED | : June 16, 2009 | |
| INVENTOR(S) | : Parsa et al. | |

It is certified that error appears in the above-identified patent and that said Letters Patent is hereby corrected as shown below:

In The Specification

In Column 1, Lines 14-17, delete "The invention.......communication device.".

In Column 4, Line 3, delete "$\square_{LO}$" and insert -- $\omega_{LO}$ --, therefor.

In Column 4, Line 16, in Equation (4), delete "$A_I V_I A_C \cos(\omega_{LO}t - \omega_B)$" and insert -- $A_I V_I A_C \cos(\omega_{LO}t + \omega_B t)$ --, therefor.

In Column 4, Lines 18-19, in Equation (5), delete "$A_I V_I A_C \cos(\omega_{LO}t - \omega_B t) + A_Q V_Q A_S \cos(\phi_e)\cos(\phi_{LO}t - \phi_B t) - A_Q V_Q A_S \sin(\omega_{LO}t - \omega_B t)$" and insert -- $A_I V_I A_C \cos(\omega_{LO}t - \omega_B t) + A_Q V_Q A_S \cos(\phi_e)\cos(\omega_{LO}t - \omega_B t) - A_Q V_Q A_S \sin(\phi_e)\sin(\omega_{LO}t - \omega_B t)$ --, therefor.

In Column 4, Line 23, delete "$\omega_{LO}$" and insert -- $\omega_{LO}.$ --, therefor.

In Column 5, Line 34, delete "In" and insert -- in --, therefor.

In Column 7, Line 43, delete "$R_{6A}C_{2A}$; $R_{5A}C_{1A}$" and insert -- $R_{6A},C_{2A}$; $R_{5A},C_{1A}$ --, therefor.

In Column 7, Lines 46-47, delete "circuit 102" and insert -- circuit 106 --, therefor.

In The Claims

In Column 9, Line 15, in Claim 6, delete "Quadrature" and insert -- quadrature --, therefor.

Signed and Sealed this
Tenth Day of May, 2016

Michelle K. Lee
*Director of the United States Patent and Trademark Office*